(12) United States Patent
Joo

(10) Patent No.: US 7,132,328 B2
(45) Date of Patent: Nov. 7, 2006

(54) METHOD OF MANUFACTURING FLASH MEMORY DEVICE

(75) Inventor: Kwang Chul Joo, Yongin-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 42 days.

(21) Appl. No.: 11/007,311

(22) Filed: Dec. 9, 2004

(65) Prior Publication Data
US 2005/0153503 A1    Jul. 14, 2005

(30) Foreign Application Priority Data
Jan. 9, 2004  (KR) .................... 10-2004-0001746

(51) Int. Cl.
*H01L 21/8238* (2006.01)
*H01L 21/336* (2006.01)
*H01L 21/4763* (2006.01)
*H01L 21/31* (2006.01)

(52) U.S. Cl. ............... 438/257; 438/201; 438/649; 438/775

(58) Field of Classification Search ............... 438/257, 438/201, 202, 221, 581, 651, 682, 770, 775
See application file for complete search history.

(56) References Cited

U.S. PATENT DOCUMENTS
6,218,689 B1 * 4/2001 Chang et al. ............... 257/288

FOREIGN PATENT DOCUMENTS
JP        06-310654        11/1994

* cited by examiner

*Primary Examiner*—Chuong Anh Luu
(74) *Attorney, Agent, or Firm*—Mayer, Brown, Rowe & Maw LLP

(57) ABSTRACT

The present invention relates to a method of manufacturing a semiconductor device. According to the present invention, an ONO1 HTO film and an ONO2 nitride film are sequentially formed on a polysilicon layer for floating gate and an oxide film for ONO3 is formed as a SiON film by oxidizing the surface of the ONO2 nitride film. Thus, the oxide film for ONO3 having a better film quality and a high dielectric constant compared to an existing HTO oxide film is formed. Accordingly, capacitance and a breakdown voltage are increased and charge leakage and retention properties are thus improved. Furthermore, it is possible to reduce the cost through reduction in process by replacing an ONO3 annealing process and a subsequent high temperature steam annealing process with a single process.

16 Claims, 2 Drawing Sheets

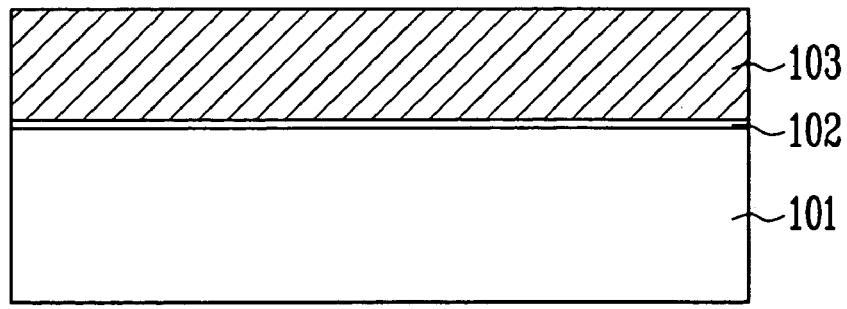
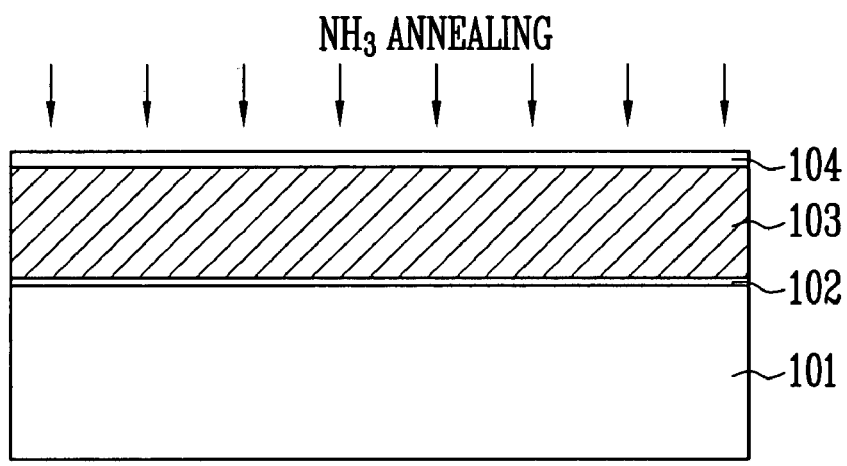
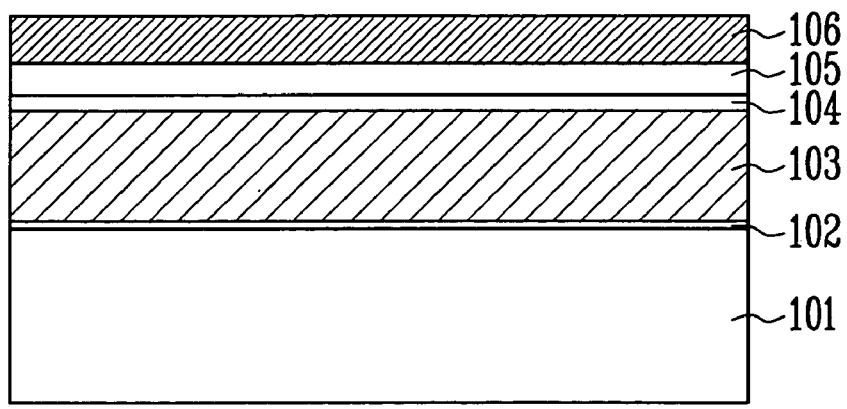

METHOD OF MANUFACTURING FLASH MEMORY DEVICE

BACKGROUND

1. Field of the Invention

The present invention relates to a method of manufacturing a flash memory device, and more specifically, to a method of manufacturing a flash memory device in which program, erase and read operational characteristics can be improved.

2. Discussion of Related Art

In a flash memory device, a dielectric film has an absolute influence upon program, erase and read characteristics in a memory cell transistor having a stack type gate structure.

Generally, a dielectric film has an ONO1/2/3 (HTO/nitride/HTO) structure. Oxide films corresponding to ONO1 and 3 are deposited by means of DCS based or MS based CVD (Chemical Vapor Deposition) method. The CVD oxide film formed by this chemical vapor deposition has a film quality lower than the oxide film typically formed through dry or wet oxidization. More particularly, the film quality and thickness of the ONO3 oxide film have an absolute influence upon charge leakage and retention properties of a memory cell.

Further, the nitride film corresponding to ONO2 has lots of apertures and is likely to be easily broken. Thus, it is required that pin holes, etc. existing in the nitride film be controlled by performing a high temperature annealing process as a subsequent process.

Accordingly, in order to obtain the charge leakage and retention properties required in the operation of a device in the flash memory device of the stack type structure, it is required that the film quality of ONO3 (HTO) as well as an ONO2 (nitride) thin film be improved through a high temperature wet annealing (for example, steam annealing) process after the ONO1/2/3 (HTO/nitride/HTO) thin film of a predetermined thickness is formed. However, as the wet annealing process of a high temperature is performed under wet atmosphere of a high temperature over a long time at the atmospheric pressure, thermal budget can be generated. Moreover, abnormal oxidization due to generation of punches of the ONO2 (nitride) thin film causes the dielectric constant of the dielectric film to change. Therefore, the program, erase and read operational characteristic of the flash memory cell can be degraded.

SUMMARY OF THE INVENTION

The present invention is directed to a method of manufacturing a flash memory device in which an ONO1 HTO film and an ONO2 nitride film are sequentially formed on a polysilicon layer for floating gate and an oxide film for ONO3 is formed to be a SiON film by oxidizing the surface of the ONO2 nitride film, so that the oxide film for ONO3 having a better film quality and a higher dielectric constant compared to an existing HTO oxide film is formed, whereby capacitance and a breakdown voltage are increased and charge leakage and retention properties are thus improved. Furthermore, by replacing an ONO3 annealing process and a subsequent high temperature steam annealing process with a single process, it is possible to reduce the cost due to reduction in process.

According to an embodiment of the present invention, there is provided a method of manufacturing a flash memory device, comprising the steps of providing a semiconductor substrate on which a polysilicon layer for floating gate is formed, sequentially forming an oxide film and a nitride film on the polysilicon layer, oxidizing the top of the nitride film to form an oxynitride film, thus forming a dielectric film in which an oxide film, a nitride film and an oxynitride film are stacked, and sequentially forming a polysilicon layer for control gate and a silicide layer on the dielectric film.

In the above, the method can further comprise the step of performing nitrification treatment for the surface of the polysilicon layer for floating gate before the oxide film is formed. At this time, the nitrification treatment can be performed using a nitrogen-containing gas at a temperature of 600° C. to 800° C. and pressure of 20 Torr to 760 Torr. A $NH_3$ gas can be solely used or a mixed gas of $NH_3/Ar$ or $NH_3/N_2$ can be used as the nitrogen-containing gas.

The oxide film can be formed using a mixed gas of $SiH_4/N_2O$ or $SiH_2Cl_2/N_2O$ and can be formed through chemical vapor deposition at a temperature of 700° C. to 900° C. and pressure of 0.05 Torr to 2 Torr. Meanwhile, a loading temperature in the process of loading the semiconductor substrate onto a deposition chamber in order to form the oxide film can be set below 300° C.

The nitride film can be formed using a mixed gas of $SiH_4/NH_3$ or $SiH_2Cl_2/NH_3$ and can be formed through chemical vapor deposition at a temperature of 600° C. to 800° C. and pressure of 0.05 Torr to 2 Torr. At this time, it is preferred that a thickness of the nitride film is decided considering that the top of the nitride film becomes the oxynitride film of a predetermined thickness.

The oxynitride film is formed by oxidizing the nitride film in a mode in which steam is formed on the surface of the semiconductor substrate by supplying an $O_2$ gas and a $H_2$ gas to a deposition chamber. At this time, the ratio of the $H_2$ gas is 33% by maximum, the pressure keeps below 20 Torr and a temperature is 800° C. to 1050° C.

Finally, the nitride film can be formed in thickness of 30 Å to 100 Å and the oxynitride film formed through oxidization loss of the nitride film can be formed in thickness of 30 Å to 100 Å.

BRIEF DESCRIPTION OF THE DRAWINGS

FIG. 1 to FIG. 5 are cross-sectional views shown to explain a method of manufacturing a flash memory device according to an embodiment of the present invention.

DETAILED DESCRIPTION OF PREFERRED EMBODIMENTS

Figure 4:
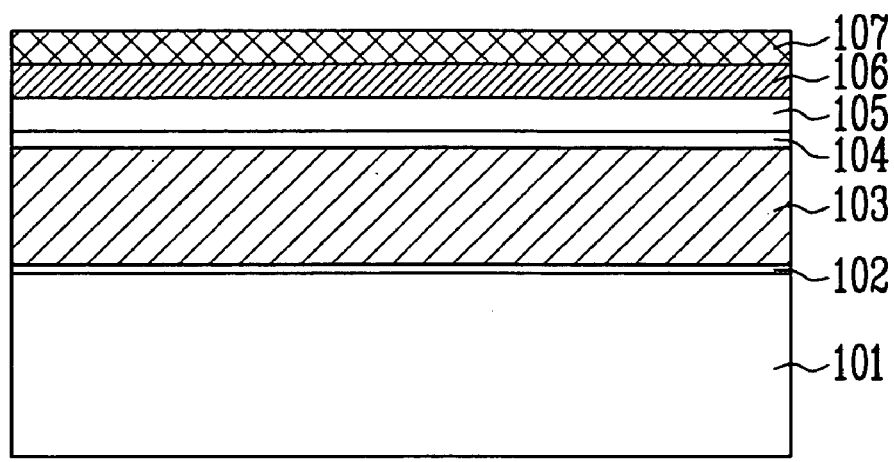

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between one film and the other film or the semiconductor substrate. Further, in the drawing, the thickness and size of each layer are exaggerated for convenience of explanation and clarity. Like reference numerals are used to identify the same or similar parts.

FIG. 1 to FIG. 5 are cross-sectional views shown to explain a method of manufacturing a flash memory device according to an embodiment of the present invention.

Referring to FIG. 1, a tunnel oxide film 102 is formed on a semiconductor substrate 101. A polysilicon layer 103 for floating gate is then formed on a tunnel oxide film 102.

At this time, P or As can be injected into the polysilicon layer 103 as an impurity. Further, the doping concentration of the impurity can be 1E20 atoms/cm$^2$ to 5E21 atoms/cm$^2$.

Meanwhile, the polysilicon layer 103 can be formed through additional doping by a plasma process under $PH_3$ atmosphere after a doped silicon layer and an undoped silicon layer are formed in a stack structure. At this time, in order to increase the surface area of the polysilicon layer 103, the surface of the undoped silicon layer can be made rugged.

After the polysilicon layer 103 is formed, the surface of the polysilicon layer 103 is cleaned. At this time, the cleaning process can be performed by dipping the semiconductor substrate 101 into an aqueous solution in which $NH_4OH$ and $H_2O_2$ are mixed in a given ratio at room temperature to 80° C. for 1 to 30 minutes or dipping it into an aqueous diluted HF solution for within 1 minute.

By reference to FIG. 2, in order to prevent an abnormal oxidization (ONO smiling) from occurring at the interface between the ONO1 oxide film and the polysilicon layer 103 due to the high temperature annealing process in the process of forming the ONO1 oxide film of the ONO dielectric film through a subsequent process, the surface of the polysilicon layer 103 undergoes nitrification treatment. Thereby, the surface of the polysilicon layer 103 becomes a nitrification-treated film 104 of a predetermined thickness.

In the above, the nitrification process can be performed using an $NH_3$ gas solely, or a mixed gas of $NH_3/Ar$ or $NH_3/N_2$ at a temperature of 600° C. to 800° C. and pressure of 20 Torr to 760 Torr.

Referring to FIG. 3, an ONO1 oxide film 105 and an ONO2 nitride film 106 are sequentially formed on the whole structure including the nitrification-treated film 104. At this time, it is preferred that the ONO1 oxide film 105 and the ONO2 nitride film 106 are formed within 2 hours with no time delay after the nitrification-treated film 104 is formed. In the above, it is preferable that the thickness of the ONO2 nitride film 106 is formed as thick as the thickness of the ONO3 SiON film, considering the thickness for forming the ONO3 SiON film that will be formed in a subsequent process.

The ONO1 oxide film 105 can be formed through chemical vapor deposition using a mixed gas of $SiH_4/N_2O$ or $SiH_2Cl_2/N_2O$ at a temperature of 700° C. to 900° C. and pressure of 0.05 Torr to 2 Torr. In the concrete, after the semiconductor substrate 101 is loaded onto a deposition chamber at a temperature of 400° C. to 700° C., the ONO1 oxide film 105 can be formed by means of a LP-CVD method at a temperature of 750° C. to 850° C. and a low pressure of 0.1 Torr to 3 Torr. At this time, in order to prohibit the surface of the polysilicon layer 103 from being oxidized, a loading temperature of the semiconductor substrate 101 can be set below 300° C. The ONO1 oxide film 105 can be formed in thickness of 30 Å to 100 Å through the above method.

Meanwhile, the ONO2 nitride film 106 can be formed through chemical vapor deposition using a mixed gas of $SiH_4/NH_3$ or $SiH_2Cl_2/NH_3$ at a temperature of 600° C. to 800° C. and pressure of 0.05 Torr to 3 Torr. In the concrete, the ONO2 nitride film 106 can be formed by means of a LP-CVD method using $NH_3$+DCS ($SiH_2Cl_2$ gas) as a reaction gas at a temperature of 650° C. to 800° C. and pressure of 1 Torr to 3 Torr. The ONO2 nitride film 106 can be formed in thickness of 30 Å to 200 Å through the above method.

By reference to FIG. 4, an ONO3 SiON film 107 is formed on the ONO2 nitride film 106. The ONO3 SiON film 107 can be formed by oxidizing the ONO2 nitride film 106 as thick as a predetermined thickness.

However, even if the nitride film as a material having good oxidization-resistant properties is oxidized under wet oxidization atmosphere of a high temperature, it is difficult to oxidize the nitride film as thick as a desired thickness. For this reason, if the nitride film is oxidized by means of a wet oxidization process of a high temperature, the nitride film is exposed to high temperature wet atmosphere over a long time with no existing ONO3 HTO oxide film. Therefore, there is a higher possibility that abnormal oxidization by punch may occur.

If $H_2$ and $O_2$ are brought into reaction on the surface of the semiconductor substrate 101 at a low pressure (e.g. below 10 Torr), however, it is possible to oxidize the nitride film within a time shorter than in the existing furnace process. Through this method, the ONO3 oxide film and a subsequent high temperature wet annealing process can be replaced. The ONO3 SiON film 107 formed by this method becomes an oxide film having a high dielectric constant and a film quality better than that formed by an existing chemical vapor deposition.

The method of forming the ONO3 SiON film 107 will now be described in more detailed manner.

The ONO2 nitride film 106 is formed on the ONO1 oxide film 105 in the deposition chamber. An $O_2$ gas and a $H_2$ gas are then supplied to the deposition chamber to form steam on the surface of the semiconductor substrate 101. At this time, the ratio of $H_2$ is 33% by maximum, a pressure keeps below 20 Torr and a temperature is 800° C. to 1050° C. The ONO3 SiON film 107 is formed as the top of the ONO2 nitride film 106 is oxidized. Thus, the ONO2 nitride film 106 is lost as thick as a thickness of the ONO3 SiON film 107. The thickness of the ONO3 SiON film 107 can be set to 1 to 1.5 times higher than the amount of the ONO2 nitride film 106 that is lost. In the concrete, the ONO3 SiON film 107 is formed by oxidizing the ONO2 nitride film 106 so that the final thickness of the ONO2 nitride film 106 becomes 30 Å to 100 Å and the thickness of the ONO3 SiON film 107 that is formed through loss of the ONO2 nitride film 106 becomes 30 Å to 100 Å. Thereby, a dielectric film 108 in which the ONO1 oxide film 105, the ONO2 nitride film 106 and the ONO3 SiON film 107 are stacked is formed.

Figure 5:
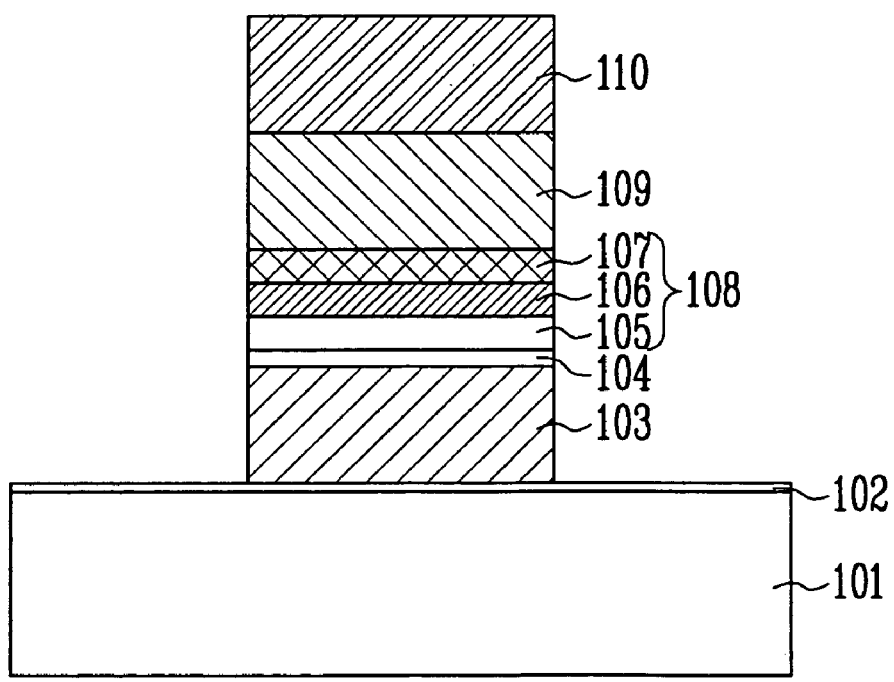

Referring to FIG. 5, a polysilicon layer 109 for control gate and a silicide layer 110 are sequentially formed on the dielectric film 108. Thereafter, though not shown in the drawings, an etch process using a gate mask and a self-aligned etch process are carried out to fabricate a flash memory cell.

It is to be noted that the aforementioned process steps are performed continuously within 2 hours with no time delay.

As described above, according to the present invention, an ONO1 HTO film and an ONO2 nitride film are sequentially formed on a polysilicon layer for floating gate and an oxide film for ONO3 is formed as a SiON film by oxidizing the surface of the ONO2 nitride film. Thus, the oxide film for ONO3 having a better film quality and a higher dielectric constant compared to an existing HTO oxide film is formed. Accordingly, capacitance and a breakdown voltage are increased and charge leakage and retention properties are thus improved. Furthermore, by replacing an ONO3 annealing process and a subsequent high temperature steam annealing process with a single process, the cost can be reduced through reduction in process.

What is claimed is:

1. A method of manufacturing a flash memory device, comprising the steps of:
   providing a semiconductor substrate on which a polysilicon layer for a floating gate is formed;
   forming a nitrification-treated film of a predetermined thickness on the polysilicon layer for the floating gate using a nitrification treatment for a surface of the polysilicon layer for the floating gate;
   sequentially forming an oxide film and a nitride film on the nitrification-treated film;
   oxidizing a top of the nitride film to form an oxynitride film, thus forming a dielectric film in which the oxide film, the nitride film and the oxynitride film are stacked; and
   sequentially forming a polysilicon layer for a control gate and a silicide layer on the dielectric film.

2. The method as claimed in claim 1, wherein the nitrification treatment is performed using a nitrogen-containing gas at a temperature of 600° C. to 800° C. and pressure of 20 Torr to 760 Torr.

3. The method as claimed in claim 2, wherein a $NH_3$ gas is solely used or a mixed gas of $NH_3/Ar$ or $NH_3/N_2$ is used as the nitrogen-containing gas.

4. The method as claimed in claim 1, wherein the oxide film is formed using a mixed gas of $SiH_4/N_2O$ or $SiH_2Cl_2/N_2O$ and is formed through chemical vapor deposition at a temperature of 700° C. to 900° C. and pressure of 0.05 Torr to 2 Torr.

5. The method as claimed in claim 1, wherein a loading temperature in the process of loading the semiconductor substrate onto a deposition chamber in order to form the oxide film is set below 300° C.

6. The method as claimed in claim 1, wherein the nitride film is formed using a mixed gas of $SiH_4/NH_3$ or $SiH_2Cl_2/NH_3$ and is formed through chemical vapor deposition at a temperature of 600° C. to 800° C. and pressure of 0.05 Torr to 2 Torr.

7. The method as claimed in claim 1, wherein a thickness of the nitride film is decided considering that the top of the nitride film becomes the oxynitride film of a predetermined thickness.

8. The method as claimed in claim 1, wherein the oxynitride film is formed by oxidizing the nitride film in a mode in which steam is formed on the surface of the semiconductor substrate by supplying an $O_2$ gas and a $H_2$ gas to a deposition chamber.

9. The method as claimed in claim 8, wherein the ratio of the $H_2$ gas is 33% by maximum, the pressure keeps below 20 Torr and a temperature is 800° C. to 1050° C.

10. The method as claimed in claim 1, wherein the final thickness of the nitride film is 30° C. to 100° C. and a thickness of the oxynitride film formed through oxidization loss of the nitride film is 30° C. to 100° C.

11. The method as claimed in claim 1, further comprising the step of performing an impurity implantation process to inject As into the polysilicon layer for the floating gate after formation of the polysilicon layer for the floating gate.

12. The method as claimed in claim 11, wherein doping concentration of the As is 1E20 atoms/$cm^2$ to 5E21 atoms/$cm^2$.

13. The method as claimed in claim 1, further comprising the step of forming an undoped polysilicon layer on the polysilicon layer for the floating gate.

14. The method as claimed in claim 13, wherein a surface of the undoped polysilicon layer is formed as a rug.

15. The method as claimed in claim 1, further comprising the step of performing a cleaning process to clean a surface of the polysilicon layer for the floating gate.

16. The method as claimed in claim 15, wherein the cleaning process is performed by dipping the semiconductor substrate into an aqueous solution in which $NH_4OH$ and $H_2O_2$ are mixed in a given ratio at room temperature to 80° C. for 1 to 30 minutes or dipping it into an aqueous diluted HF solution for within 1 minute.

* * * * *